(12) United States Patent  
Kuramori

(10) Patent No.: US 7,586,791 B2  
(45) Date of Patent: Sep. 8, 2009

(54) DELAY CIRCUIT FOR CONTROLLING A PRE-CHARGING TIME OF BIT LINES OF A MEMORY CELL ARRAY

(75) Inventor: Bunsho Kuramori, Tokyo (JP)

(73) Assignee: Oki Semiconductor Co., Ltd. (JP)

( * ) Notice: Subject to any disclaimer, the term of this patent is extended or adjusted under 35 U.S.C. 154(b) by 36 days.

(21) Appl. No.: 11/902,220

(22) Filed: Sep. 20, 2007

(65) Prior Publication Data

US 2008/0080256 A1 Apr. 3, 2008

(30) Foreign Application Priority Data

Sep. 29, 2006 (JP) ............................. 2006-268040

(51) Int. Cl.  
*G11C 16/04* (2006.01)

(52) U.S. Cl. ........................... 365/185.25; 365/185.18; 365/233.5; 365/203

(58) Field of Classification Search ............ 365/185.25, 365/185.18, 233.5, 203, 194  
See application file for complete search history.

(56) References Cited

U.S. PATENT DOCUMENTS

| 5,453,709 | A | 9/1995 | Tanimoto et al. |
| 6,456,540 | B1 * | 9/2002 | Baltar et al. ............ 365/189.09 |
| 7,027,341 | B2 * | 4/2006 | Morikawa ................... 365/203 |

* cited by examiner

*Primary Examiner*—David Lam  
(74) *Attorney, Agent, or Firm*—Studebaker & Brackett PC; Donald R. Studebaker

(57) ABSTRACT

A semiconductor memory device includes an array of memory cells and an adjustment circuit for adjusting the pulse width of an address transition detect equalizer (AT-DEQ) signal. The adjustment circuit receives an address transition detection (ATD) signal and is responsive to the level changes of voltages Vp and Vn to adjust the pulse width of the ATDEQ signal accordingly. The resulting signal ATDEQ is supplied to a power supply circuit for a bit line selector for selecting a bit line of the array of memory cells. The device can thus accomplish the readouts of bit "0" and bit "1" in a state less liable to delay.

5 Claims, 10 Drawing Sheets

DELAY CIRCUIT FOR CONTROLLING A PRE-CHARGING TIME OF BIT LINES OF A MEMORY CELL ARRAY

BACKGROUND OF THE INVENTION

1. Field of the Invention

The present invention relates to a semiconductor memory device, and more particularly to a circuit for use in a semiconductor memory device for controlling the pre-charging time of the bit lines of an array of memory cells for storing data therein.

2. Description of the Background Art

As an electrically programmable non-volatile memory, there has so far been known a type of non-volatile memory including an array of memory cells, each of which is composed of transistors and interconnected to a word line and a bit line to generally form a bi-dimensional matrix, in which the bit line of any of the memory cells to be read out is connected via a selector to a read-out amplifier to cause the memory cell to conduct current, which is in turn compared to the current of a reference memory cell so as to read out data stored in the cell.

In this type of non-volatile memory cell, when the readout operation is to be switched from one memory cell to another, the control bit line is connected to the memory cells at all times in the same direction, thereby causing no significant change in current flowing over the control bit line. However, a memory cell to be read out includes the possibility of a read "1" cell, from which to read out binary "1", and a read "0" cell, from which to read binary out "0". Hence, if a bit "1" is read out followed by reading out a bit "0", for example, then the current continues to flow until the bit line is charged to a certain level, thus causing it to take some period of time until determining a binary "0" read out.

With such a readout system of non-volatile memories, it would be possible to speed up the readout of bit "0" by using a CSV (memory cell readout voltage) level as a reference voltage for a readout amplifier, i.e. amplifier reference voltage, setting the voltage on the bit line in a stabilized state to a voltage approximately equal to the voltage CSV, generating an address transition detection (ATD) signal at the time of switching the cell to be read out, i.e. readout cell, and forcing the bit line, connected to the readout cell thus selected in response to the ATD signal, to be charged to the CSV level, or amplifier reference voltage.

The circuit for generating the ATD signal is provided in a non-volatile memory fabricated in the form of semiconductor integrated circuit device, and is constituted by P-channel metal-oxide semiconductor (MOS) transistors for delay and complimentary MOS (CMOS) transistors for delay so as to be substantially free from voltage and temperature dependency and not susceptible to variations in threshold voltage of the transistors. Such a delay circuit for regulating a delay time against variations in MOS transistor characteristics and ambient temperature is taught by U.S. Pat. No. 5,453,709 to Tanimoto et al., for instance.

With this known technique, however, the delay circuit could not reflect, on its output, variations in cell current and CSV voltage ascribable to the internal voltages, such as voltage CSV charging the bit lines and the voltage cell word line (VCW) voltage. Hence, it is highly probable that the readout of bit "0" could not be sufficiently speeded up although so intended, and delay is caused in the readout of bit "1".

Specifically, in order to pre-charge a bit line for speeding up the readout of bit "0", a shorter period of time may be sufficient when the voltage CSV is low because the charging level is low, thus reaching the pre-charging state in such a short time. Conversely, when the pre-charging period is prolonged, the bit line is over-charged, thus causing the readout of bit "1" to delay.

The period of time to pre-charge a bit line to speed up the readout of bit "0" is needed longer when the voltage CSV is high because the charging level is high. If the pre-charging time is short, the charging is insufficient, thus causing the readout of bit "0" to delay.

In case the voltage VCW is low in level, the current flowing through a memory cell, that is cell current, is decreased to cause the charging time to be prolonged, thus causing delay in readout of an expected "1". It is therefore necessary to make the charging time shorter. Since the cell current in this case is inherently small., the readout of an expected "0" may be accomplished quickly even with a short charging time.

In case the voltage VCW is of a low level, the cell current is increased. Thus, if the charging time is prolonged, to a more or less extent, the charges stored on a bit line are restored quickly through the memory cell to its optimum level. Hence, the delay is scarcely caused in the readout of an expected value of "1". Conversely, for readout of an expected value of "0", leakage may occur in a memory cell where the write of the bit is insufficient to render it difficult to read out the binary "0". It is therefore necessary to charge the bit line sufficiently. If the charging time is shorter in this case, the delay may be caused in reading out an expected value of "0".

SUMMARY OF THE INVENTION

It is therefore an object of the present invention to provide a semiconductor integrated circuit device in which the readouts of bit "0" and bit "1" may be accomplished in a state less liable to delay.

In accordance with the present invention, a semiconductor memory device for storing data in an array of memory cells interconnected to bit lines and word lines, comprises a charging circuit for charging the bit lines, an adjustment circuit for adjusting the pre-charging time charging the bit line, and a voltage supply circuit for supplying an internal voltage associated with increase or decrease of the cell current flowing through the memory cells. The adjustment circuit is responsive to the internal voltage to control the pulse width of an address transition detection signal for the array of memory cells.

In accordance with an aspect of the present invention, a semiconductor memory device for storing data in an array of memory cells interconnected to bit lines and word lines, comprises a charging circuit for charging the bit lines, an adjustment circuit for adjusting the pre-charging time charging the bit line, and a voltage supply circuit for supplying an internal voltage associated with the charging level of the bit line. The adjustment circuit is responsive to the internal voltage to control the pulse width of an address transition detection signal.

According to the present invention, the pre-charging time is adjusted in response to the internal voltage associated with increase or decrease of the cell current or to the charging level of the bit line to prevent over-charging and under-charging of the bit line, whereby control may be to a state less liable to delay in the readout operation.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 2:
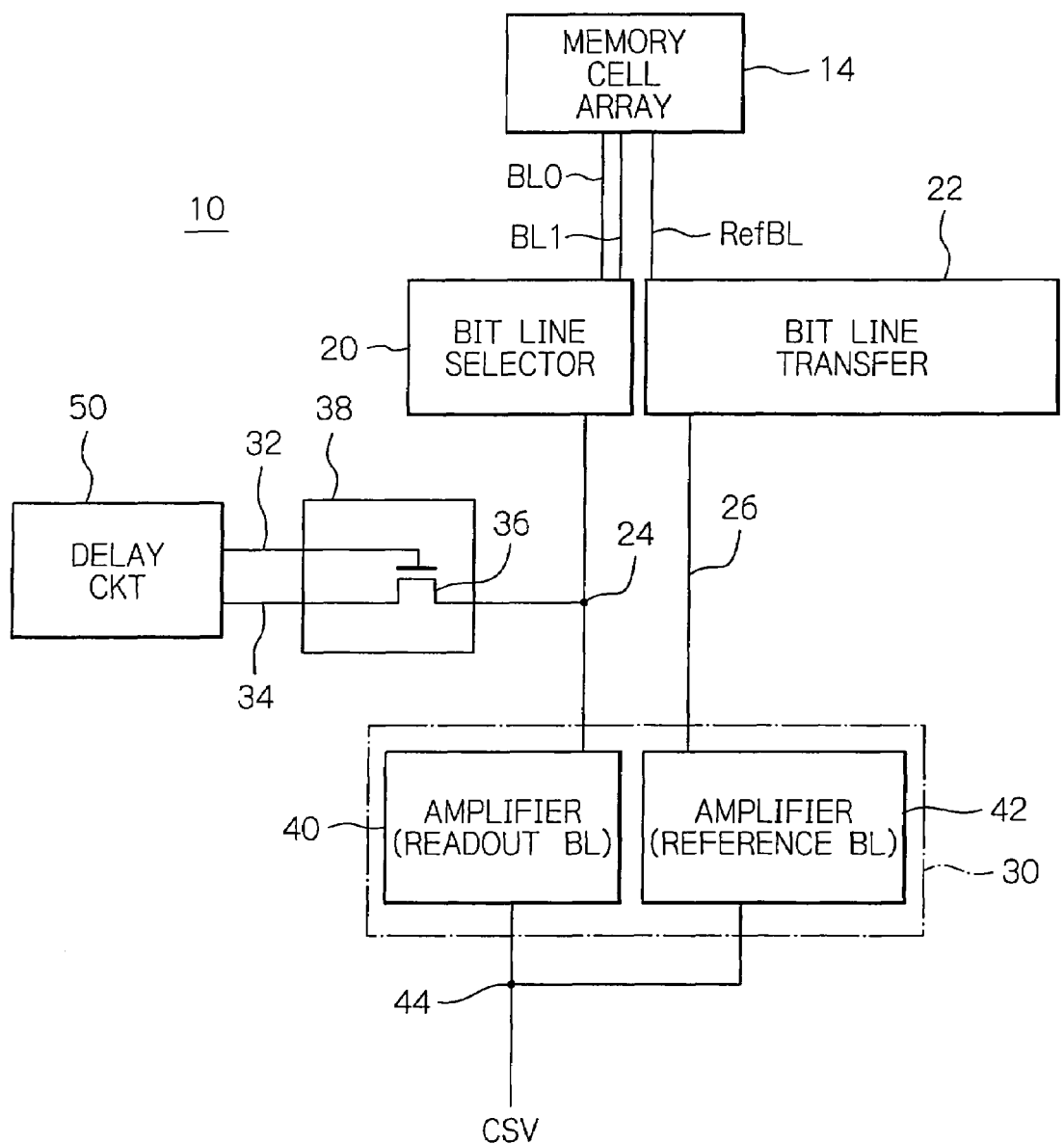
FIG. 2 is a schematic block diagram showing an illustrative embodiment of a non-volatile memory device to which the delay circuit is applied in accordance with the present invention.

With reference to the accompanying drawings, a preferred embodiment of a semiconductor integrated circuit device of the present invention will be described in detail. Reference will first be made to FIG. 2, which is a schematic block diagram showing a non-volatile memory device 10 according to the present invention. The non-volatile memory device 10 of the present embodiment includes an array of memory cells 14, to which are coupled word lines WL0, WL1, ..., FIG. 3, bit lines BL0, BL1, ... and a reference bit line RefBL. The memory device 10 further includes a bit line selector 20 for selecting a bit line, and a bit line transfer circuit 22 for transferring the voltage of reference level.

The bit line selector 20 and the bit line transfer circuit 22 are connected to an amplifier circuit 30 by connection lines 24 and 26, respectively. The amplifier circuit 30 is adapted to sense the current on each of the bit lines. The amplifier circuit 30 includes a readout amplifier 40 for amplifying and sensing the current on a transistor 12a on the reading-out side of a memory cell 12, FIG. 3, and a reference amplifier 42 for amplifying and sensing the current on the reference bit line. The amplifiers 40 and 42 are each supplied with a readout voltage CSV at node 44 operating as a reference voltage.

The connection line 24 is further connected to a power supply 38 having a transistor 36 that is adapted to pre-charge the bit lines. The power supply 38 is responsive to a signal ATDEQ (Address Transition Detect Equalizer) supplied to an input 32 to supply the readout voltage CSV to a node of the connection line 24. The readout voltage CSV is an internal voltage associated with, or dependent upon, the increase or decrease of the cell current. The power supply 38 has its control input 32 connected a delay circuit 50.

In practice, the non-volatile memory device 10 includes an addressing circuit for selecting a word line (WL) and a write circuit used to write data. These are, however, not shown merely for simplicity. Parts or components not directly relevant to understanding the present invention will not be shown nor described.

Figure 3:
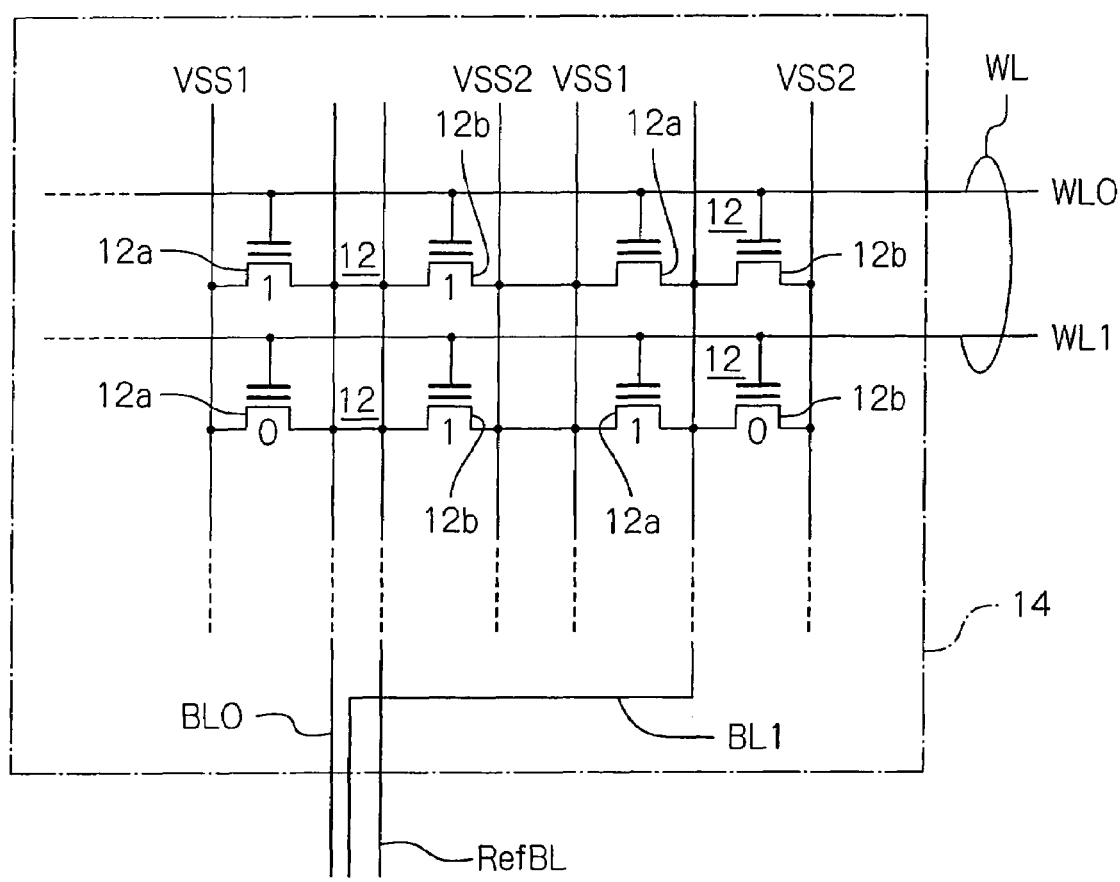
FIG. 3 is a schematic circuit diagram showing an example of a memory cell array to which the present invention is applied.

The array of memory cells 14 includes, as shown in FIG. 3 illustrating its embodiment, plural word lines WL0, WL1, ... interconnecting the floating gates of transistors 12a and 12b, ..., forming the memory cells 12, and plural bit lines BL0, BL1, ... interconnecting the source or drain electrodes of the transistors 12a and 12b of the memory cells 12. The word lines and the bit lines are arranged substantially perpendicular to one another to form a bi-dimensional matrix. The bit line BL0 is connected to the bit line selector 20, while the reference bit line RefBL is connected to the bit line transfer circuit 22 that transfers the reference level. The bit lines BL0, BL1, ... involve parasitic capacitances which are likely to increase as the array of memory cells are designed to increase in terms of storage capacity. It is noted that although the array of memory cells 14 is formed up of a number of memory cells 12 in practice, FIG. 3 shows only some of the memory cells 12 in the memory cell array 14 merely for simplicity.

The power supply 38, connected by the connection line 24 to the bit line selector 20, is turned on responsive to the signal ATDEQ, generated on switching between the word lines WL0 and WL1, that is, upon switching of the memory cells to be read out, to apply the voltage CSV via the transistor 36 to the connection line 24. The connection line 24 is connected selectively to either of the bit lines BL0 and BL1 selected by the bit line selector 20 to supply the current that pre-charges the so connected bit line as well as the current from the amplifier 40. Thus, the potential may quickly be increased on the selected bit line with its parasitic capacitance charged. This means that the potential on the bit line goes positive so quickly at the time of word line switching as to reduce delay in accessing the memory cells.

The delay circuit 50, connected to inputs 32 and 34 of the power supply 38, is adapted to deliver the signal ATDEQ 32 and the readout voltage CSV 34 to the power supply 38. The delay circuit 50 of the present embodiment is configured to adjust the pulse width of the signal ATDEQ 32 to output the resulting signal. Signals are designated with reference numerals for connection lines on which they appear.

Figure 1:
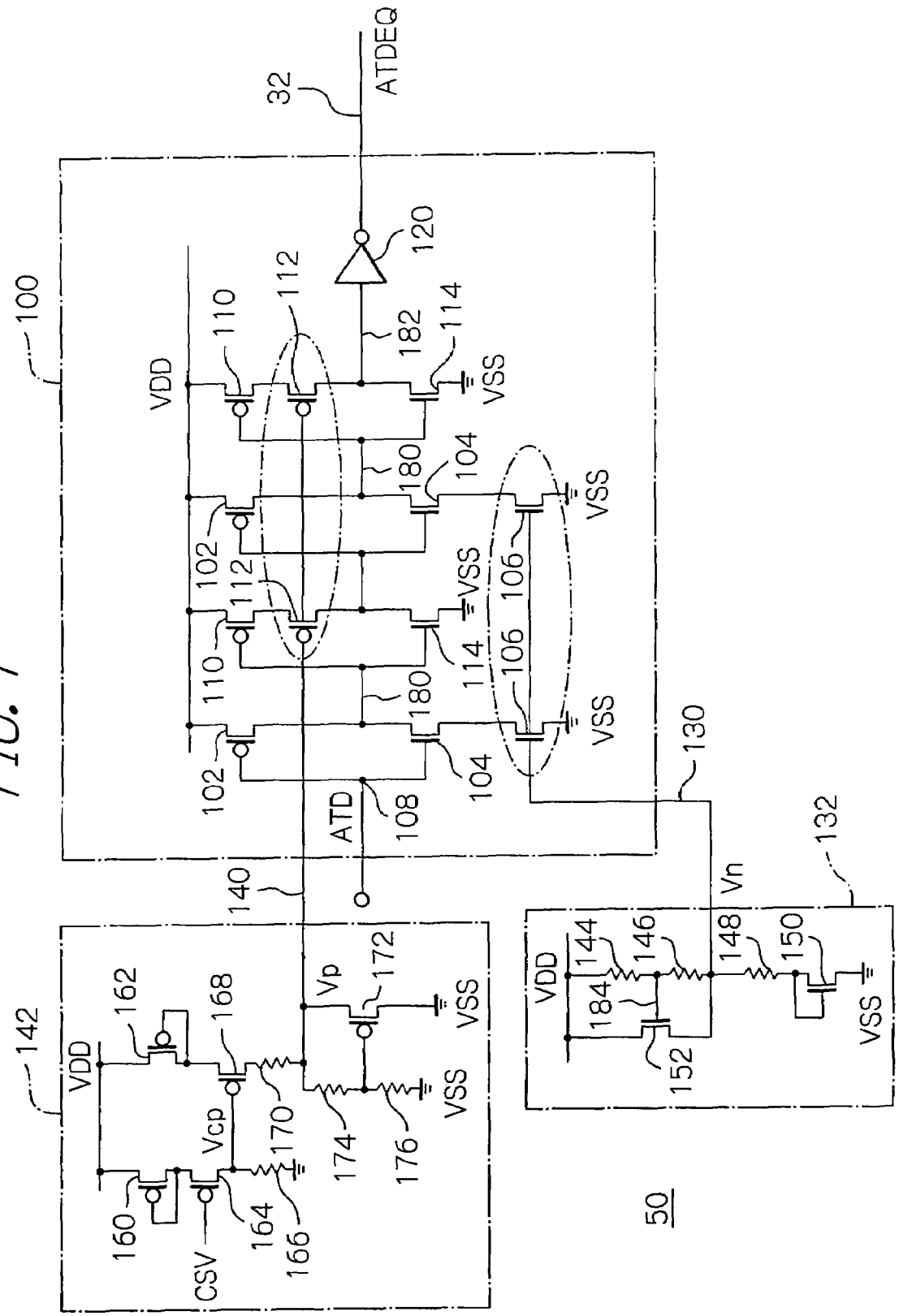
FIG. 1 is a schematic circuit diagram showing an illustrative embodiment of a delay circuit in accordance with the present invention.

Well, FIG. 1 shows an exemplified inner structure of the delay circuit 50. As shown, the delay circuit 50 includes an adjustment circuit 100 that receives a signal ATD (Address Transition Detect) to adjust its pulse width depending on a voltage Vp and a voltage Vn. The signal ATD indicates that the address transition has been detected. The adjustment circuit 100 generally includes two sets of circuits each made up of a P-channel metal-oxide semiconductor (MOS) transistor, sometimes referred to below as PMOS transistor, 102, an N-channel MOS transistor, sometimes referred to below as NMOS transistor, 104, and an N-channel MOS transistor 106. The PMOS transistor 102 has its drain electrode connected to a power supply VDD. The NMOS transistor 104 has its source electrode connected to the source electrode of the PMOS transistor 102, and the NMOS transistor 106 has its source electrode connected to the drain electrode of the NMOS transistor 104, while having its drain electrode connected to another power supply VSS. As shown, the signal ATD is supplied to a junction 108 between the PMOS transistor 102 and the NMOS transistor 104 forming the initial stage of the adjustment circuit 100.

The adjustment circuit 100 further includes two sets of a PMOS transistor 110 having its drain electrode connected to the power supply VDD, a PMOS transistor 112 having its drain electrode connected to the source electrode of the PMOS transistor 110, and an NMOS transistor 114 having its source electrode connected to the source electrode of the PMOS transistor 112. The NMOS transistor 114 has its drain electrode connected to the power supply VSS. The PMOS transistor 110 and the NMOS transistor 114 have the respective gate electrodes thereof connected to each other and also to a junction 180 between the PMOS transistor 102 and the NMOS transistor 104 forming the stage preceding thereto.

The NMOS transistor 104 and the NMOS transistor 106re are thus provided in two sets. The NMOS transistor 106 has its source electrode connected to the drain electrode of the NMOS transistor 104 while having its drain electrode connected to the power supply VSS. A junction 182 of the PMOS transistor 112 and the NMOS transistor 114 forming the last stage is connected to an inverter 120, which is adapted to output a signal corresponding to the inversion of the potential at the junction on its output 32 as a signal ATDEQ.

The NMOS transistors 106 function as delay transistors connected to a voltage Vn generator 132 by a connection line 130 connected to the gate electrodes of the transistors. Specifically, each NMOS transistor 106 adjusts the pulse width of the signal ATD 108 depending on the voltage appearing on the connection line 130. The PMOS transistors 112 are also delay transistors connected to a voltage Vp generator 142 by a connection line 140 connected to the gate electrodes of the transistors. Specifically, each PMOS transistor 110 is adapted to adjust the pulse width of the signal ATD 108 depending on the voltage appearing on the connection line 140.

The voltage Vn generator 132 includes a series connection of resistors 144, 146 and 148 and an N-channel transistor 150, which has its gate and source electrodes interconnected together. The NMOS transistor 150 is connected to the power supply VSS. To a junction 184 of the resistors 144 and 146 is connected the gate electrode of an NMOS transistor 152, which has its drain electrode connected, along with the junction of the resistors 144 and 148, to the connection line 130.

The voltage Vp generator 142 includes PMOS transistors 160 and 162, which have the respective gate and source electrodes thereof connected together. To the gate and source electrodes of the PMOS transistor 160 is further connected the drain electrode of another PMOS transistor 164. The readout voltage CSV is supplied to the gate electrode of the PMOS transistor 164, which has its source electrode connected via a resistor 166 to the power supply VSS. A junction VCP of the PMOS transistor 164 and the resistor 166 is connected to the gate electrode of another PMOS transistor 168.

The PMOS transistor 168 has its drain electrode connected to the PMOS transistor 162, while having its gate electrode supplied with the voltage VCP at the junction VCP. The PMOS transistor 168 has its source electrode connected via a resistor 170 to the connection line 140. To the connection line 140 are connected another PMOS transistor 172 and a resistor 174. The resistor 174 is further connected via another resistor 176 to the power supply VSS. The connection line 140 constitutes an output of the voltage Vp generator 142 and is connected to the adjustment circuit 100.

The operation of the delay circuit 50, having the above-described constitution, will now be described. If the voltage CSV is increased, the voltage VCP at the junction VCP is decreased. With decrease in the voltage VCP, the voltage Vp on the junction 140 is increased. Hence, the signal ATDEQ, corresponding to the input signal ATD on the input 108, having its pulse width increased, is delivered to the output 32. Conversely, if the voltage CSV is decreased, the voltage VCP at the junction VCP is increased. With increase in the voltage VCP, the voltage Vp on the connection line 140 is decreased. Hence, the signal ATDEQ, corresponding to the input signal ATD, having its pulse width decreased, is delivered to the output 32.

Thus, with the non-volatile memory device 10, including the delay circuit 50, shown in FIG. 1, pulse width control is exercised so that, if the voltage CSV is increased, the pre-charge pulse width becomes longer, whereas, if the voltage CSV is decreased, the pre-charge pulse width becomes shorter. This removes over-charging in the state of voltage CSV low and under-charging in the state of voltage CSV high, so that both the readouts of bit "0" and bit "1" may be carried out in a state where delay is less liable to be produced.

An alternative embodiment of the voltage Vp generator, provided in the delay circuit 50, will now be described with reference to FIG. 4. Like components are designated with the same reference numerals. A voltage Vp generator 400 is adapted to receive voltages VCW and VDD to deliver a voltage Vp on its output 140. The voltage VCW is an internal voltage associated with increase or decrease of the cell current. The output 140 is coupled to the adjustment circuit 100 exemplified in FIG. 1 to constitute a delay circuit. The voltage Vn generator may be constituted similarly to the voltage Vn generator 132 shown in FIG. 1.

The voltage Vp generator 400 also includes two PMOS transistors 402 and 404, and a resistor 406 between a power supply VCW generating the voltage VCW and a power supply VSS. Between the power supply VDD and the power supply VSS, the voltage Vp generator also includes two PMOS transistors 408 and 410, and a resistor 412. A junction 430 of the PMOS transistor 404 and the resistor 406 is connected to the gate electrode of the PMOS transistor 410.

To a junction 432 of the source electrode of the PMOS transistor 410 and the resistor 412 is connected the gate electrode of a PMOS transistor 414, and a voltage VWP is applied to this gate electrode. The PMOS transistor 414 has its drain electrode connected via a PMOS transistor 416 to the power supply VDD, and the PMOS transistor 414 has its source electrode connected via resistors 418, 420 and 422 to the power supply VSS. To a junction 434 of resistors 418 and 420 is connected the drain electrode of a PMOS transistor 424, which has its gate electrode connected to a junction 436 of the resistors 420 and 422. The PMOS transistor 424 has its source electrode connected to the power supply VSS. A voltage Vp is generated on the drain electrode of the PMOS transistor 424 and is applied on the output 140 to the adjustment circuit 100, FIG. 1.

In the voltage Vp generator 400, if the voltage cell word line (VCW) is increased, the voltage VWP at the junction 432 is lowered. With the voltage VWP thus lowered, the voltage Vp is increased. As a result, control is exercised for elongating the pulse width of the output signal ATDEQ 32 of the adjustment circuit 100. Conversely, if the voltage VCW is decreased, the voltage VWP at the junction VWP is raised, where as, if the voltage VWP is raised, the voltage Vp is decreased. As a result, control is exercised for shortening the pulse width of the output signal ATDEQ 32 of the adjustment circuit 100.

In the present embodiment, described above, when the voltage VCW is increased, the pulse width of the pre-charging signal ATDEQ 32 becomes longer, whereas, if the voltage VCW is lowered, the pulse width of the signal ATDEQ 32 becomes shorter. Hence, over-charging in the state of the voltage VCW low and under-charging in the state of the voltage VCW high may be removed, resulting in the readout operations of bit "0" and bit "1" less liable to delay.

An alternative embodiment of the voltage Vp generator will now be described with reference to FIG. 5. A voltage Vp generator 500 of the present alternative embodiment may be the same as the voltage Vp generator 400, shown in FIG. 4, except that the generator 500 includes a PMOS transistor 502 which is connected between the PMOS transistor 416 and the PMOS transistor 414 and has its gate electrode connected via a resistor 504 to the power supply VSS and further connected to the power supply VDD via PMOS transistors 506 and 508, and that the voltage CSV is delivered to the gate electrode of the PMOS transistor 506.

In the voltage Vp generator 500 in the present alternative embodiment, if the voltage CSV is increased, the voltage VCP on the junction VCP is lowered. If the voltage VCP is lowered, the voltage Vp is increased. As a result, control is exercised for elongating the pulse width of the output signal ATDEQ 32 of the adjustment circuit 100. Conversely, if the voltage CSV is decreased, the voltage VWP is raised. If the voltage VWP is raised, the voltage Vp is decreased. As a result, control is exercised for shortening the pulse width of the output signal ATDEQ 32 of the adjustment circuit 100.

Figure 4:
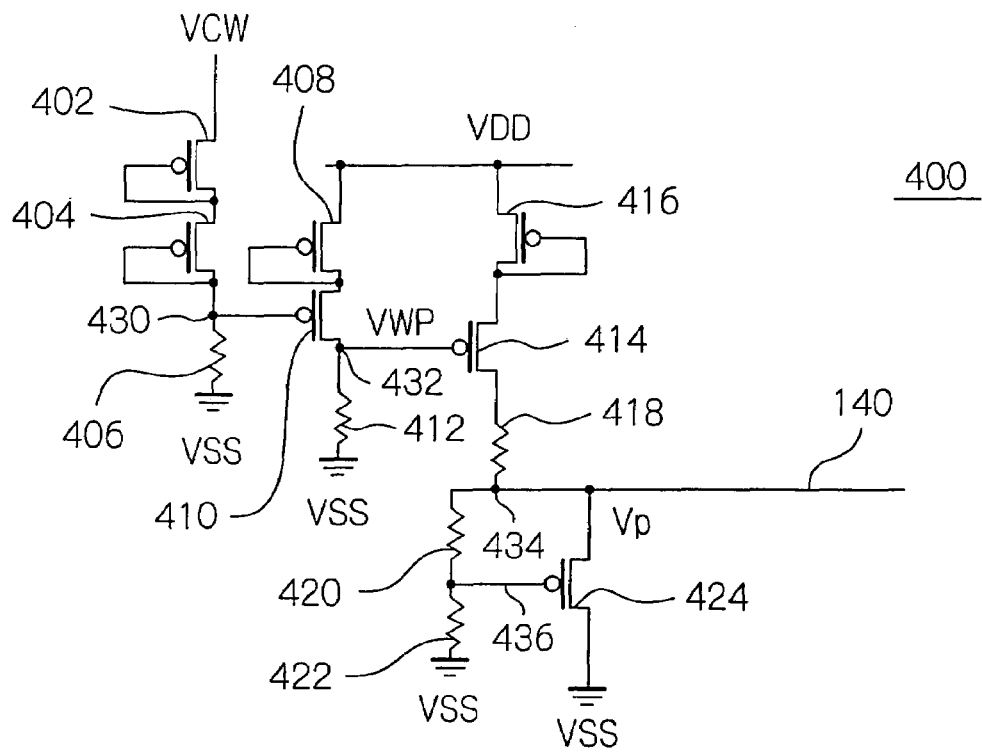
FIGS. 4 and 5 are schematic circuit diagrams showing alternative embodiments of a voltage Vp generator applicable to the illustrative embodiment shown in FIG. 1.
Figure 5:
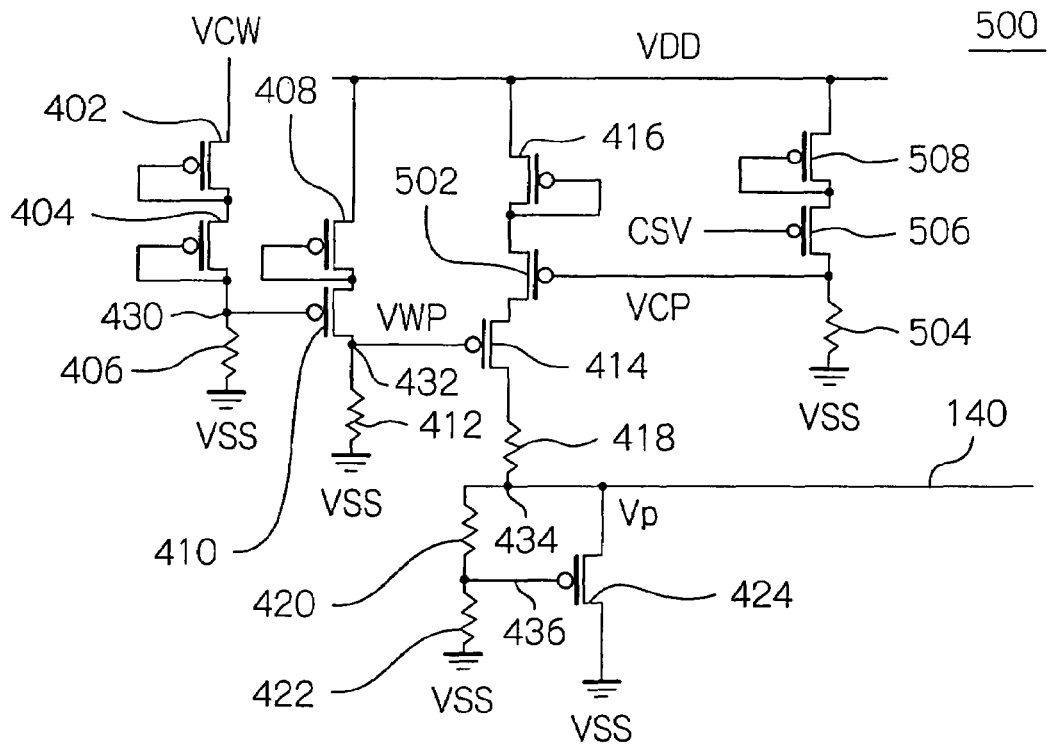

The voltage Vp generator 500 is similar to the embodiment shown in FIG. 4 as to the fact that, if the voltage VCW is increased, the voltage VWP is decreased to elongate the pulse width of the output signal ATDEQ 32 of the adjustment circuit 100, and that, if the voltage VCW is lowered, the voltage VWP is increased, with the voltage Vp being lowered to shorten the pulse width of the signal ATDEQ 32.

In the present alternative embodiment, described above, when the voltage CSV is increased, the pulse width of the pre-charging signal ATDEQ 32 becomes longer, whereas, if the voltage CSV is decreased, the pulse width becomes shorter. If the voltage VCW becomes higher, the pulse width of the signal ATDEQ 32 becomes longer, whereas, if the voltage VCW is lowered, the pulse width becomes shorter. Hence, over-charging in the state of the voltage CSV low and under-charging in the state of the voltage CSV high may be removed, whereas over-charging in the state of the voltage VCW low and under-charging in the state of the voltage VCW high may also be removed, resulting in the readout operations of bit "0" and bit "1" less liable to delay.

Figure 6:
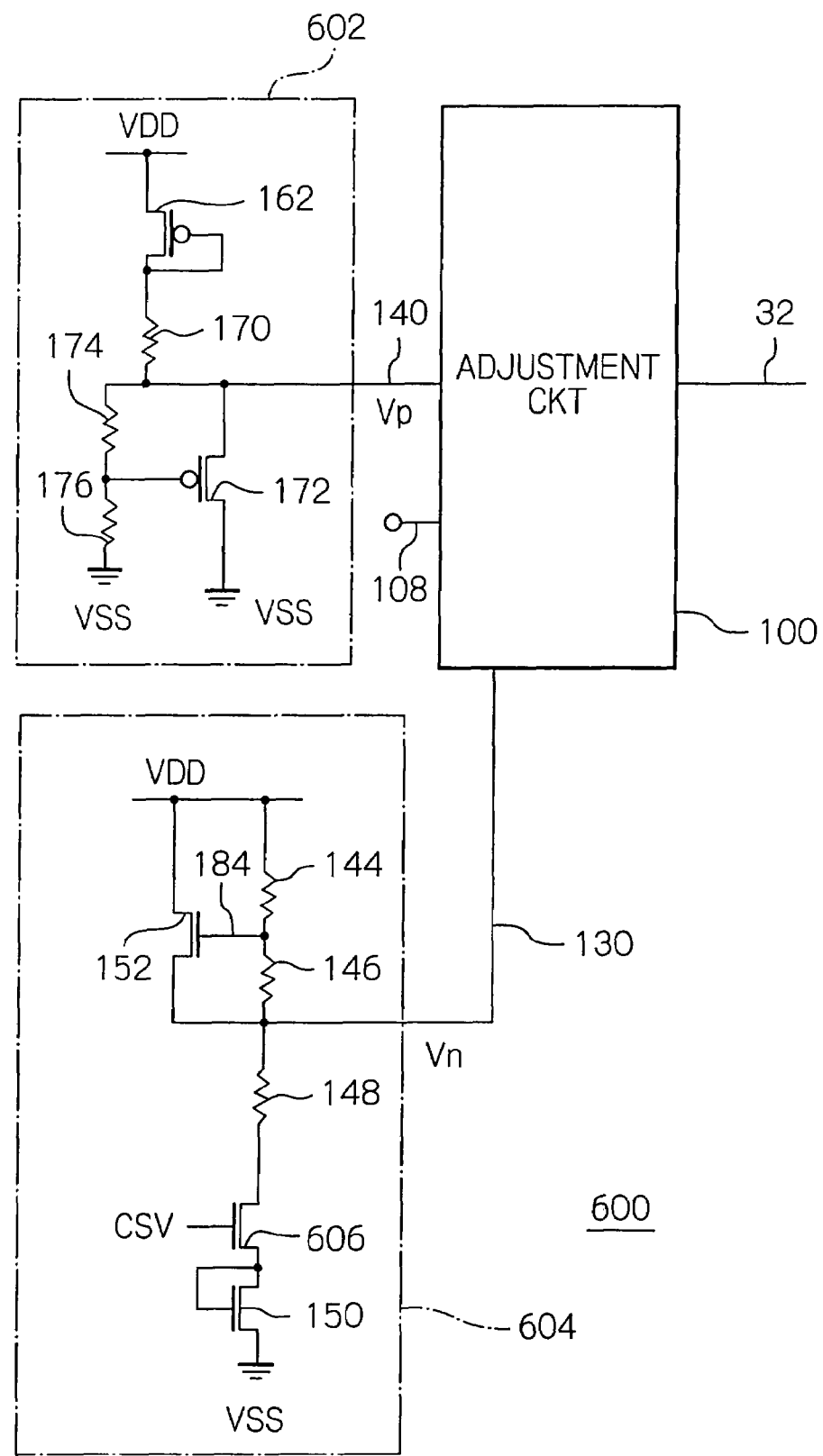
FIG. 6 is a schematic circuit diagram showing an alternative embodiment of the delay circuit in accordance with the present invention.

An alternative embodiment of a delay circuit according to the present embodiment will now be described with reference to FIG. 6. A delay circuit 600 of the instant alternative embodiment includes a voltage Vp generator 602 which generates a voltage Vp, a voltage Vn generator 604 which generates a voltage Vn, and the adjustment circuit 100 connected to the output 140 of the voltage Vp generator 602 and the output 130 of the voltage Vn generator 604. The inner constitution of the adjustment circuit 100 is not shown in FIG. 6.

The voltage Vp generator 602 is of the general constitution corresponding to the voltage Vp generator 142 of FIG. 1 from which the PMOS transistor 160, the PMOS transistor 164, PMOS transistor 168 and the resistor 166, receiving the voltage CSV to generate the voltage VCP, have been removed.

The voltage Vn generator 604 includes an NMOS transistor 606 connected between the resistor 148 and the NMOS transistor 150 described on the voltage Vn generator 132 with reference to FIG. 1, and the voltage CSV is supplied to the gate electrode of the NMOS transistor 606. The remaining constitution of the voltage Vn generator 604 may be the same as the voltage Vn generator 132, FIG. 1.

If the voltage CSV supplied to the NMOS transistor 606 of the present alternative embodiment is increased, the voltage Vn at the junction Vn is increased. As a result, control is exercised for shortening the pulse width of the output signal ATDEQ 32 of the adjustment circuit 100. Conversely, if the voltage CSV is decreased, the voltage Vn is decreased. As a result, control is exercised for elongating the pulse width of the output signal ATDEQ 32.

Thus, in the present alternative embodiment, if the voltage CSV is increased, the pulse width of the pre-charge signal ATDEQ 32 becomes longer, whereas, if the voltage CSV is decreased, the pulse width of the output signal ATDEQ 32 becomes shorter. This removes over-charging in the state of the voltage CSV low and under-charging in the state of the voltage CSV high, so that both the readouts of bit "0" and bit "1" may be carried out in a state where delay is less liable to be produced.

Figure 7:
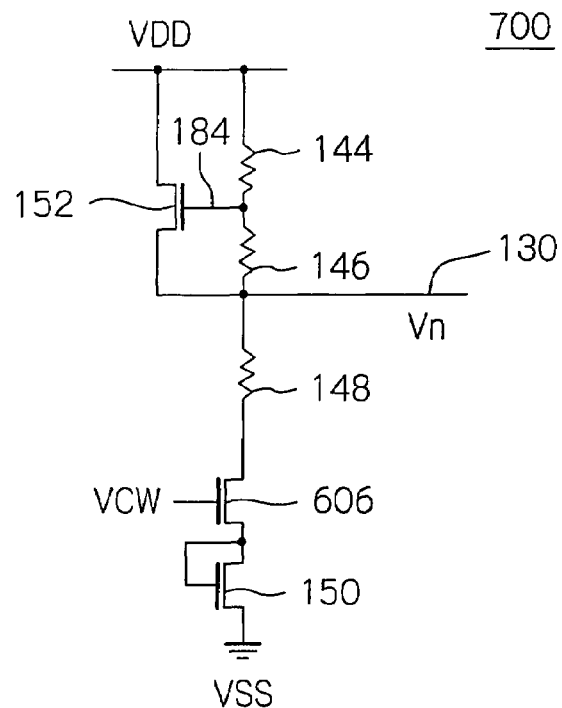
FIGS. 7 and 8 are schematic circuit diagrams showing alternative embodiments of a voltage Vn generator applicable to the alternative embodiment shown in FIG. 6.

Another alternative embodiment of the voltage Vn generator will now be described with reference to FIG. 7. A voltage Vn generator 700 of the present alternative embodiment may be the same as the voltage Vn generator 604 in the delay circuit 600, shown in FIG. 6, except that the voltage VCW is supplied to the gate electrode of the NMOS transistor 606. The voltage Vn generator 700 may be provided in the delay circuit 600 to take the place of the voltage Vn generator 604.

In the voltage Vn generator 700 of the present embodiment, if the voltage VCW is decreased, the voltage Vn at the junction Vn increases, as a result of which the pulse width of the output signal ATDEQ 32 of the adjustment circuit 100 becomes shorter. Conversely, if the voltage VCW increases, the voltage Vn decreases, as a result of which the pulse width of the output signal ATDEQ 32 becomes shorter.

Thus, in the present alternative embodiment, if the voltage VCW is increased, the pulse width of the pre-charge signal ATDEQ 32 becomes longer, whereas, if the voltage VCW is decreased, the pulse width becomes shorter. This removes over-charging in the state of the voltage VCW low and under-charging in the state of the voltage VCW high, so that both the readouts of bit "0" and bit "1" may be carried out in a state where delay is less liable to be produced.

Figure 8:
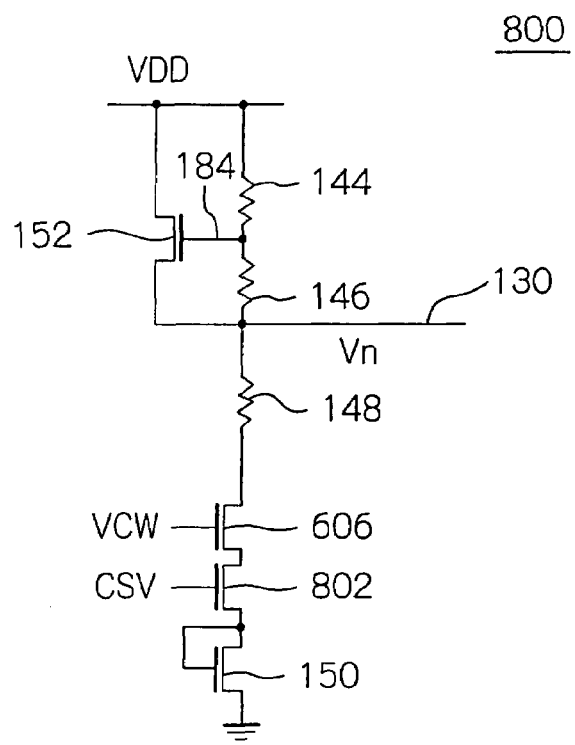

A further alternative embodiment of the voltage Vn generator will now be described with reference to FIG. 8. As shown, a voltage Vn generator 800 of the present embodiment may be the same as the voltage Vn generator 700 of FIG. 7 except that the generator 800 have an NMOS transistor 802 connected between the NMOS transistor 606 and the NMOS transistor 150, and the voltage CSV is supplied to the gate electrode of the NMOS transistor 802.

In the Vn generator 800 of the present alternative embodiment, if the voltage CSV becomes lower, the voltage Vn is increased, with the pulse width of the output signal ATDEQ 32 of the adjustment circuit 100 becoming shorter. If the voltage CSV is becomes higher, the voltage Vn is decreased, with the pulse width of the output signal ATDEQ 32 of the adjustment circuit 100 becoming longer. Further, if the voltage VCW is lowered, the voltage Vn is increased, with the pulse width of the signal ATDEQ 32 becoming shorter. If the voltage VCW is becomes higher, the voltage Vn is lowered, with the pulse width of the signal ATDEQ 32 becoming longer.

Thus, with the present alternative embodiment, if the voltage CSV is higher, the pulse width of the signal ATDEQ 32 becomes longer, whereas, if the voltage CSV is lower, the pulse width of the signal ATDEQ 32 becomes shorter. Further, if the voltage VCW is higher, the pulse width of the signal ATDEQ 32 becomes longer, whereas, if the voltage VCW is lower, the pulse width of the signal ATDEQ 32 becomes shorter. This removes over-charging in the state of the voltage CSV low and under-charging in the state of the voltage CSV high, while removing over-charging in the state of the voltage VCW low and under-charging in the state of the voltage VCW high. The result is that both the readouts of bit "0" and bit "1" may be carried out in a state where delay is less liable to be produced.

Figure 9:
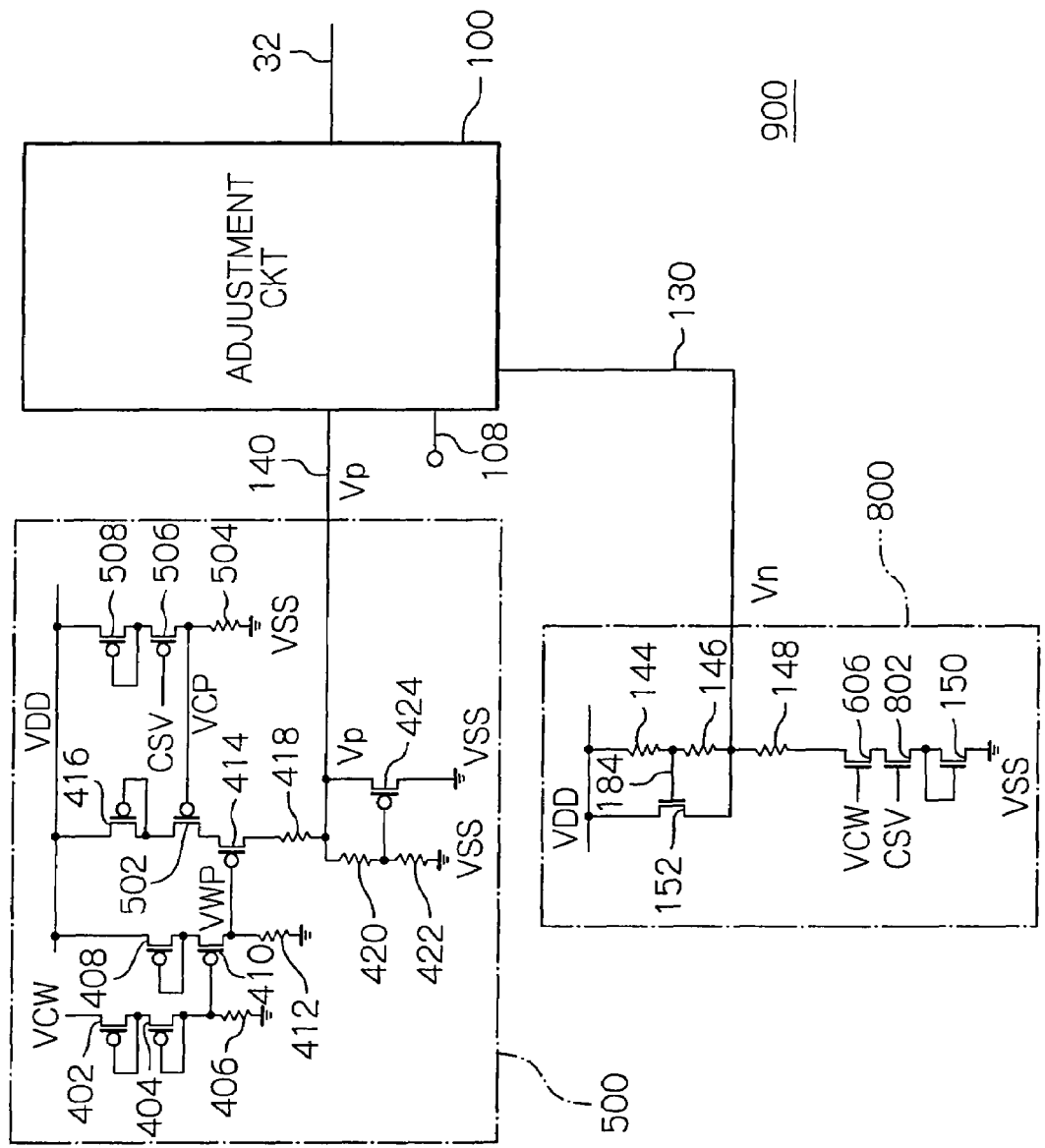
FIGS. 9-12 are schematic circuit diagrams, like FIG. 1, showing alternative embodiments of the delay circuit in accordance with the present invention.

A further alternative embodiment of the delay circuit will now be described with reference to FIG. 9. A delay circuit 900 of the present alternative embodiment includes the voltage Vp generator 500 shown in FIG. 5 and the voltage Vn generator 800 shown in FIG. 8. The output 140 of the voltage Vp generator 500 and the output 130 of the voltage Vn generator 800 are connected to the adjustment circuit 100 to deliver the signal ATDEQ 32 at the output 32.

In the delay circuit 900 of the present alternative embodiment, if the voltage CSV becomes higher, the voltage VCP at the junction VCP becomes lower. The voltage Vp is increased, while the voltage Vn is decreased, whereby the pulse width of the signal ATDEQ 32 becomes longer. Conversely, if the voltage CSV becomes lower, the voltage VCP at the junction VCP becomes higher. The voltage Vp is decreased, while the voltage Vn is increased, where by the pulse width of the signal ATDEQ 32 becomes shorter. Also, if the voltage VCW becomes higher, the voltage VWP becomes lower. The voltage Vp is increased, while the voltage Vn is decreased, whereby the pulse width of the signal ATDEQ 32 becomes longer. Conversely, if the voltage VCW becomes lower, the voltage VWP becomes higher. The voltage Vp is decreased, while the voltage Vn is increased, whereby the pulse width of the signal ATDEQ 32 becomes shorter.

Thus, with the present alternative embodiment, if the voltage CSV becomes higher, the pulse width of the signal ATDEQ 32 becomes longer, whereas, if the voltage CSV becomes lower, the pulse width of the signal ATDEQ 32 becomes shorter. If the voltage VCW becomes higher, the pulse width of the signal ATDEQ 32 becomes longer, whereas, if the voltage VCW becomes lower, the pulse width of the signal ATDEQ 32 becomes shorter. This removes over-charging in the state of the voltage CSV low and under-charging in the state of the voltage CSV high, while removing over-charging in the state of the voltage VCW low and under-charging in the state of the voltage VCW high. Consequently, the readouts of bit "0" and bit "1" may both be carried out in a state where delay is less liable to be produced.

Figure 10:
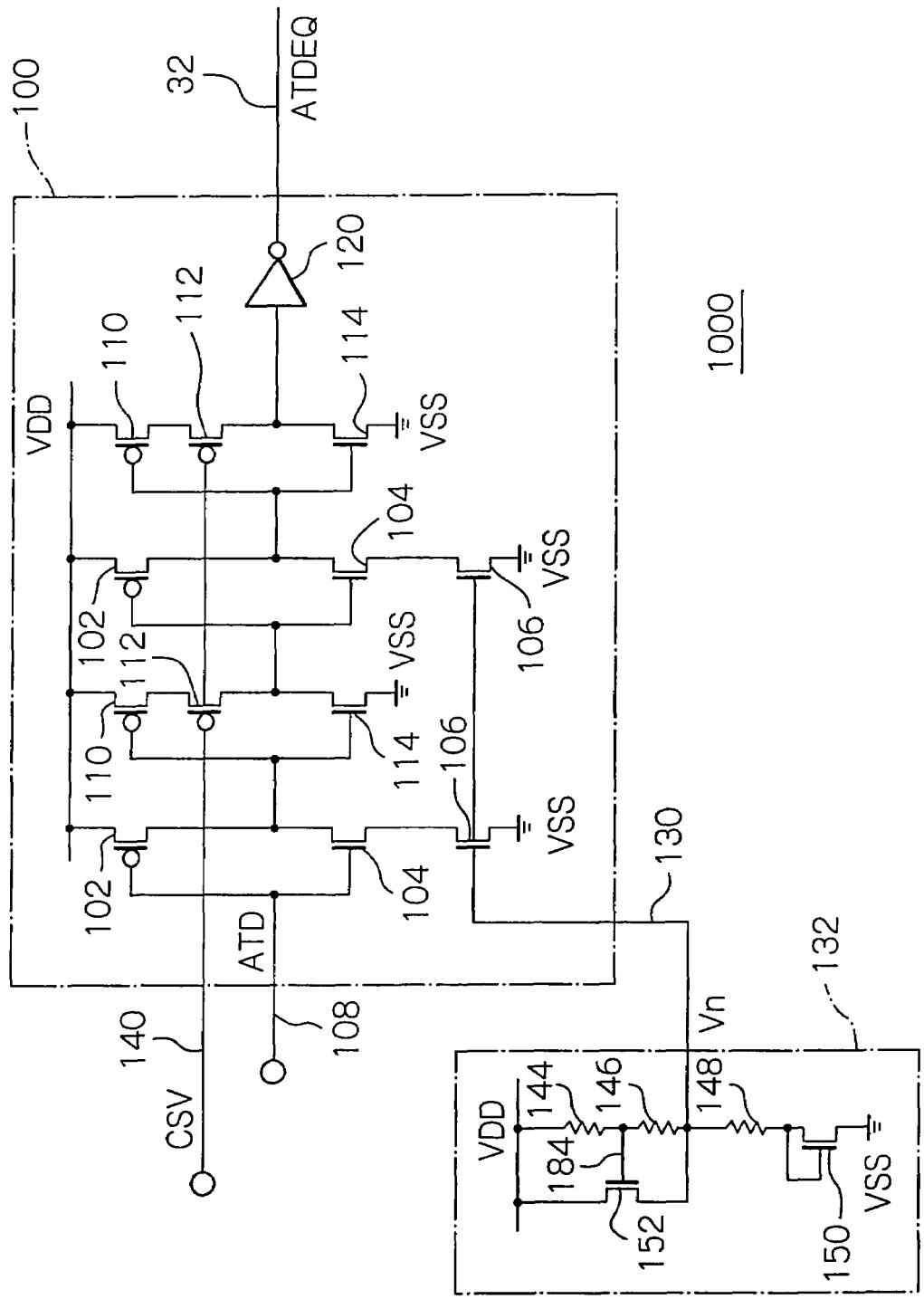

A still further alternative embodiment of the delay circuit will now be described with reference to FIG. 10. A delay circuit 1000 of the present alternative embodiment may be the same as the embodiment shown in FIG. 1 except that the voltage Vp generator 142 in the delay circuit 50 shown in FIG. 1 is removed, and the voltage CSV is supplied to the input 140 of the adjustment circuit 100.

In the delay circuit 1000 of the present alternative embodiment, if the voltage CSV supplied to the adjustment circuit 100 is lower or higher, then the pulse width of the signal ATDEQ 32 becomes shorter or longer, respectively.

Thus, according to the present alternative embodiment, when the voltage CSV becomes higher or lower, the pulse width of the signal ATDEQ 32 becomes longer or shorter, respectively. This removes over-charging in the state of the voltage CSV low and under-charging in the state of the voltage CSV high, so that the readouts of bit "0" and bit "1" may both be carried out in a state where delay is less liable to be produced. The present alternative embodiment may be applied with the advantages to such a case where the variation in the voltage VDD is small, which is an internal voltage with respect to, for example, the external voltage VCC, that is, the voltage VDD is substantially flat.

A yet alternative embodiment of the delay circuit will now be described with reference to FIG. 11. A delay circuit 1100 in the present alternative embodiment includes a voltage Vp generator 1102 and a voltage Vn generator 132. The output 140 of the voltage Vp generator 1102 and the output 130 of the voltage Vn generator 132 are connected to the adjustment circuit 100 to deliver the signal ATDEQ 32 to the output 32. The voltage Vn generator 132 and the adjustment circuit 100 maybe configured similarly to the constitutions indicated by the same reference numerals in FIG. 1.

The voltage Vp generator 1102 includes PMOS transistors 1104 and 1106, and a resistor 1108 which are interconnected between a power supply VCW generating a voltage VCW and a power supply VSS. A junction Vp between the PMOS transistor 1106 and the resistor 1108 constitutes the output 140 of the voltage Vp generator 1102 and delivers the voltage Vp to the adjustment circuit 100.

In the voltage Vp generator 1102 of the present alternative embodiment, the voltage Vp at a junction Vp becomes lower, as the voltage VCW becomes lower, as a result of which the pulse width of the output signal ATDEQ 32 of the adjustment circuit 100 becomes shorter. Conversely, if the voltage VCW becomes higher, the voltage Vp is increased, with the pulse width of the signal ATDEQ 32 becoming longer.

Thus, according to the present alternative embodiment, the pulse width of the signal ATDEQ 32 becomes longer or shorter when the voltage VCW becomes higher or lower, respectively. This removes over-charging in the state of the voltage VCW low and under-charging in the state of the voltage VCW high, so that both the readouts of bit "0" and bit "1" may be carried out in a state where delay is less liable to be produced. The present alternative embodiment may be applied with the advantages to such a case where the variation in the voltage VDD is small, which is an internal voltage with respect to, for example, the external voltage VCC, that is, the voltage VDD is substantially flat.

Figure 12:
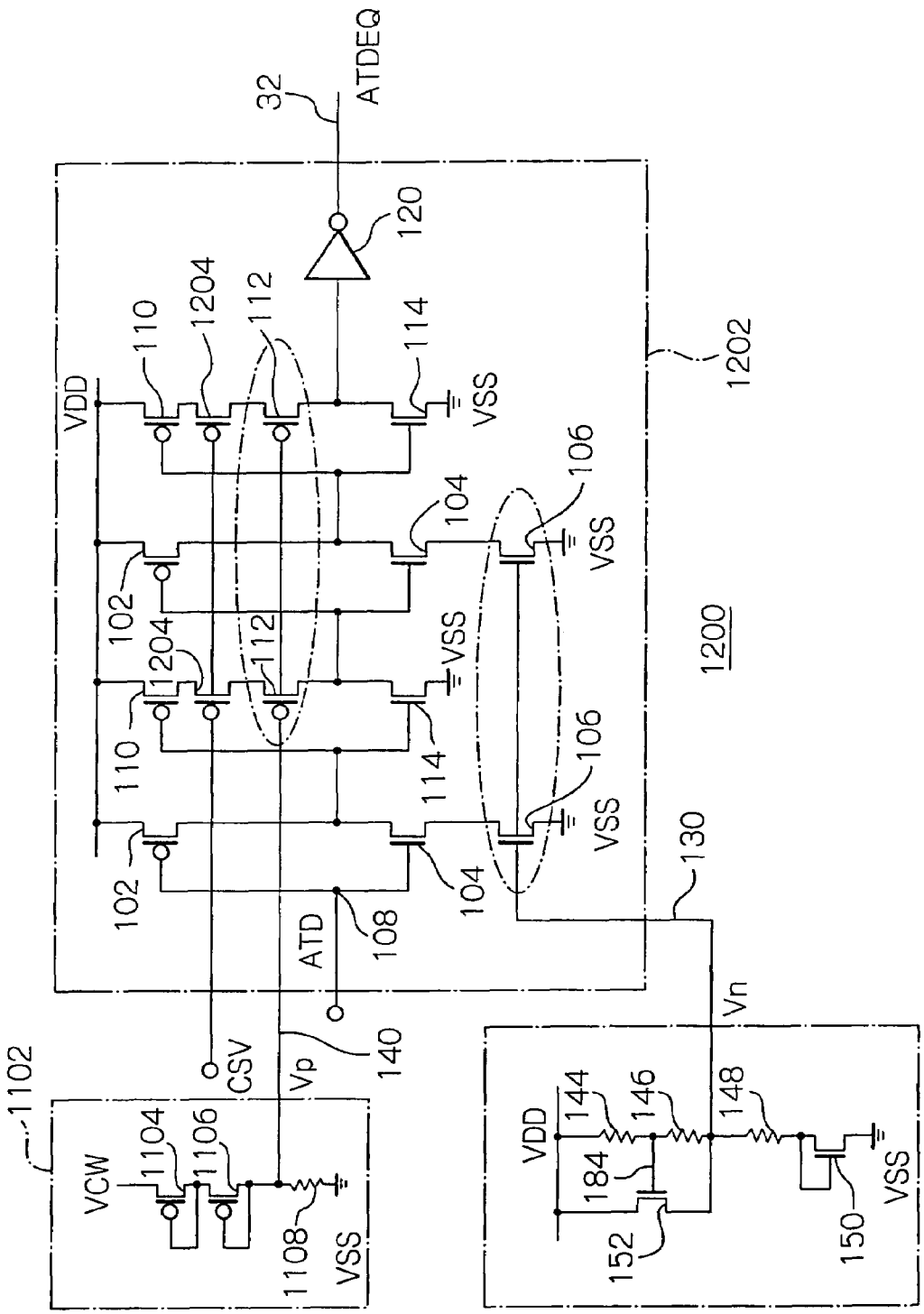

A further alternative embodiment of the delay circuit will now be described with reference to FIG. 12. As shown, a delay circuit 1200 includes a voltage Vp generator 1102 and the voltage Vn generator 132. The output 140 of the voltage Vp generator 1102 and the output 130 of the voltage Vn generator 132 are connected to an adjustment circuit 1202 to deliver the output signal ATDEQ to the output 32. The voltage Vp generator 1102 and the voltage Vn generator 132 may be configured similarly to the corresponding circuits shown in FIG. 1.

The adjustment circuit 1202 of the present alternative embodiment may be the same as the adjustment circuit 100 of FIG. 1 except that, in the inner constitution of the adjustment circuit 100, shown in FIG. 1, a PMOS transistor 1204 is connected between the PMOS transistors 110 and 112. As to the remaining points, the adjustment circuit 1202 may be similar in constitution to the adjustment circuit 100. The voltage CSV is supplied to the gate electrode of the PMOS transistor 1204.

Figure 11:
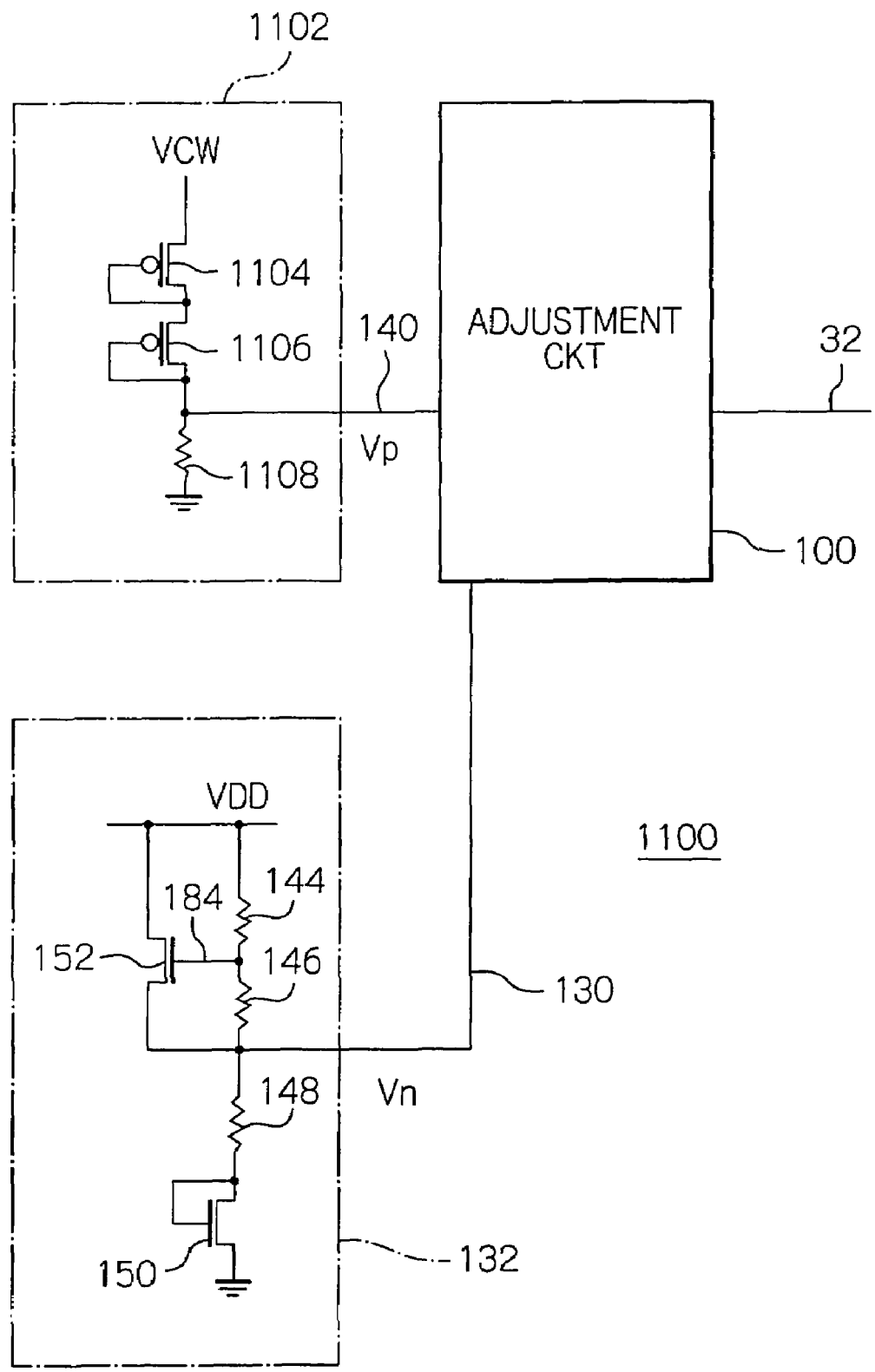

In the delay circuit 1200, like the embodiment shown in FIG. 11, the voltage Vp is increased with increase in the voltage VCW, with the pulse width of the signal ATDEQ 32 becoming longer. If the voltage VCW is lowered, the voltage Vp is lowered, with the pulse width of the signal ATDEQ 32 becoming shorter. Further, in the delay circuit 1200, if the voltage CSV is lowered which is supplied to the adjustment circuit 1202, then the pulse width of the signal ATDEQ 32 becomes shorter. Conversely, if the voltage CSV is increased, the pulse width of the signal ATDEQ 32 becomes longer.

In the instant alternative embodiment, described above, if at least one of the voltages CSV and VCW becomes higher, the pulse width of the pre-charge signal ATDEQ 32 becomes longer, whereas, if one or both of the voltages CSV and VCW is lowered, the pulse width becomes shorter. This removes over-charging in the state where one or both of the voltages CSV and VCW is low, while removing under-charging in the state where one or both of the voltages CSV and VCW is high, so that both the readouts of bit "0" and bit "1" may be carried out in a state where delay is less liable to be produced. The present alternative embodiment may be applied with the advantages to such a case where the variation in the voltage VDD is small, which is an internal voltage with respect to, for example, the external voltage VCC, that is, the voltage VDD is substantially flat.

The entire disclosure of Japanese patent application No. 2006-268040 filed on Sep. 29, 2006, including the specification, claims, accompanying drawings and abstract of the disclosure, is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A semiconductor memory device for storing data in an array of memory cells interconnected to bit lines and word lines, comprising:
    a charging circuit for charging the bit lines;
    an adjustment circuit for adjusting a pre-charging time charging the bit lines; and
    a voltage supply circuit for supplying a first internal voltage and a second internal voltage associated with increase and decrease of cell current flowing through the memory cells,
    said adjustment circuit including:
    a P-channel MOS transistor as a delay device responsive to the internal voltage to control a pulse width of an address transition detection signal for the array of memory cells and having a first gate electrode controllable to adjust the pulse width;
    an inverter for inverting an output from the P-channel MOS transistor; and
    an N-channel MOS transistor as a delay device responsive to the internal voltage to control the pulse width of an address transition detection signal for the array of memory cells and having a second gate electrode controllable to adjust the pulse width.

2. The device in accordance with claim 1, wherein said adjustment circuit controls the pulse width so that, when the cell current is increased, a charging time for the bit lines will be longer, and, when the cell current is decreased, the pre-charging time will be shorter.

3. A semiconductor memory device for storing data in an array of memory cells interconnected to bit lines and word lines, comprising:
    a charging circuit for charging the bit lines;
    an adjustment circuit for adjusting a pre-charging time charging the bit line; and
    a voltage supply circuit for supplying a first internal voltage and a second internal voltage associated with a charging level of the bit line,
    said adjustment circuit including:
    a P-channel MOS transistor as a delay device responsive to the internal voltage to control a pulse width of an address transition detection signal for the array of memory cells and having a first gate electrode controllable to adjust the pulse width;
    an inverter for inverting the output from the P-channel MOS transistor; and
    an N-channel MOS transistor as a delay device responsive to the internal voltage to control the pulse width of an address transition detection signal for the array of memory cells and having a second gate electrode controllable to adjust the pulse width.

4. The device in accordance with claim 3, wherein the internal voltage is a readout voltage for the memory cells.

5. The device in accordance with claim 3, wherein the pre-charging time is shortened when the charging level for the bit line is low, and the pre-charging time is elongated when the charging level for the bit line is high.

* * * * *